United States Patent [19]

Maley et al.

[11] Patent Number: 4,564,772
[45] Date of Patent: Jan. 14, 1986

[54] LATCHING CIRCUIT SPEED-UP TECHNIQUE

[75] Inventors: Gerald A. Maley, Fishkill; Douglas W. Westcott, Wappingers Falls, both of N.Y.

[73] Assignee: International Business Machines Corporation, Armonk, N.Y.

[21] Appl. No.: 509,273

[22] Filed: Jun. 30, 1983

[51] Int. Cl.[4] .................................................. G11C 5/06
[52] U.S. Cl. ..................................... 307/443; 307/480; 307/291; 307/591
[58] Field of Search ............... 307/443, 465, 475, 480, 307/272 R, 272 A, 289, 291, 591, 593, 601, 605; 365/154

[56] References Cited

U.S. PATENT DOCUMENTS

| | | | |
|---|---|---|---|
| 2,942,192 | 6/1960 | Lewis | 328/92 |
| 3,154,744 | 10/1964 | Maley | 328/92 |
| 3,467,839 | 9/1969 | Miller | 307/289 |
| 3,530,384 | 7/1968 | Zussman | 328/92 |
| 3,679,915 | 7/1972 | Kriger | 307/289 |
| 3,723,760 | 3/1973 | Ebrahimi | 307/203 |
| 3,740,590 | 6/1973 | Hart et al. | 307/443 X |
| 3,783,254 | 1/1974 | Eichelberger | 307/465 X |
| 3,882,325 | 5/1975 | Sakalay | 307/218 |
| 4,019,144 | 4/1977 | Lincoln et al. | 328/92 |
| 4,078,204 | 3/1978 | Gauthier | 328/21 |
| 4,085,341 | 4/1978 | Reinert | 307/480 X |
| 4,314,166 | 2/1982 | Bismarck | 307/475 |
| 4,315,167 | 2/1982 | Pelc | 307/443 X |
| 4,439,690 | 3/1984 | Maley et al. | 307/272 R |

FOREIGN PATENT DOCUMENTS 2137068  4/1980  Fed. Rep. of Germany.

OTHER PUBLICATIONS

"Manual of Logic Circuits", G. A. Maley, Prentice Hall, 1970, p. 78.
IBM TDB, vol. 5, No. 11, Apr. 1963, "Gating Network for Oscillators", G. A. Maley & R. W. Miller, pp. 101-102.

Primary Examiner—Stanley D. Miller
Assistant Examiner—D. R. Hudspeth
Attorney, Agent, or Firm—Robert J. Haase

[57] ABSTRACT

A latching circuit with reduced signal delay is disclosed comprising a latch and an output logic function circuit. The same signals are applied to the output gate of the latch and to the logic function circuit, whereby the output gate and the logic function circuit effectively are connected in parallel, rather than in series, to eliminate one level of logic delay. An additional logic signal is applied only to the logic function circuit but not to the latch. Provision can be made for applying inverted data to the latch in the event that the latch and the logic function circuit are implemented with NAND or NOR gates.

4 Claims, 6 Drawing Figures

LATCHING CIRCUIT SPEED-UP TECHNIQUE

DESCRIPTION

1. Technical Field

This invention relates to latching circuits comprising a latch followed by a logic circuit connected in tandem and, more particularly, to a reconfigured latching circuit wherein substantially no additional time is required for input data to pass through the latch function and the logic function than is required to pass through the latch function.

2. Background Art

With the development of constantly faster computing machines, there has been a decrease in the number of logic level delays that a signal passes through in propagating between successive latches. The consequence is that an increasing percentage of time is consumed simply in passing signals through latches. Accordingly, it is increasingly important that the time of signal passage through latches be minimized. This is especially true where level sensitive scan designs are employed for logic circuits with its attendant double latch configuration, i.e., one latch immediately following another latch. Level sensitive scan design and its use in the testing of logic circuits is described in U.S. Pat. No. 3,783,254 for "Level Sensitive Logic System", to Eichelberger, issued on 1/1/74 and assigned to the present assignee.

One technique for limiting signal delay through latches is to minimize the number of cascaded constituent logic elements by combining the logic function of the output element of a preceding latch with that of the input element of a succeeding latch, where said elements are of the same kind. This technique is shown on page 78 of the book by G. A. Maley, "Manual of Logic Circuits", Prentice Hall, 1970. Although the number of cascaded logic elements is reduced, the same signal delay is encountered as measured from the input to the latch to the circuit point at which the desired output logic signal is first available.

SUMMARY OF THE INVENTION

A propagational delay of one logic gate level is eliminated in an array of logic gates of similar kind by applying the same signals to the output gate of a latch and to the input gate of the immediately following output logic circuit comprising the same latching circuit. At least one additional logic signal also is applied to said input gate. The aforesaid latch and logic circuit comprise the same latching circuit. The propagational delay inherent in the logic gate is expended simultaneously with, rather than subsequent to, the propagational delay of the latch of the same latching circuit. Thus, a level of logic gate delay is eliminated for each latching circuit in a gate array and a substantial improvement in logic array performance is achieved. In the known prior art, the logic gate and its attendant delay are concatenated with the latch and its attendant delay.

BEST MODE FOR CARRYING OUT THE INVENTION

Figure 1:
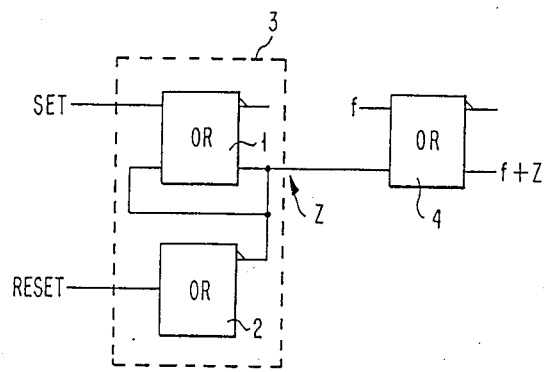
FIG. 1 is a schematic circuit diagram of a prior art current switch set-reset latching circuit.

FIG. 1 is a schematic circuit of a standard current switch set-reset latching circuit such as is described on page 224 of the aforecited book "Manual of Logic Design". The circuit comprises inverting OR (NOR) blocks 1 and 2, which are interconnected to form the set-reset latch 3, and NOR block 4. Latch 3 provides a signal representing output logic function Z which is OR'd with an additional signal in block 4 to produce an output signal representing the logic function $f+Z$.

Figure 2:
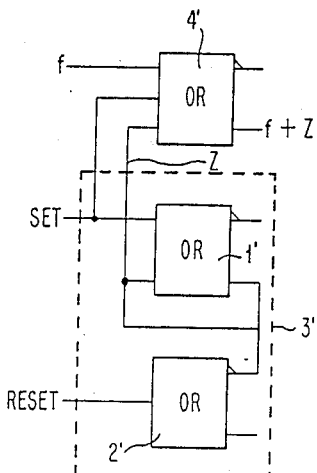
FIG. 2 is a reconfigured embodiment of the circuit of FIG. 1 in accordance with the present invention.

FIG. 2 shows a reconfigured embodiment of the latching circuit of FIG. 1 wherein block 3 of FIG. 1 is connected essentially in parallel with block 1 rather than in tandem with it as in FIG. 1. The blocks of FIG. 2 corresponding to the blocks of FIG. 1 are designated by correspondingly primed numbers.

In FIG. 1, the SET input term at the input of block 1 propagates to the output of block 4 with a time delay equal to the delay of the two levels of logic blocks 1 and 4. In FIG. 2, on the other hand, the SET input term propagates to the function output of block 4 in only one level of logic block delay, i.e., the delay of block 4 itself. In the cases of both FIGS. 1 and 2, the function outputs of block 4 and 4' are exactly the same ($f+Z$), the only difference being the increased speed with which the function is generated by the reconfigured circuit of FIG. 2 relative to the prior art technique of FIG. 1. The higher speed of the latching circuit of FIG. 2 is obtained at the minor expense of adding one additional input to block 4' (the SET input) which is not required as an input to corresponding block 4 of FIG. 1.

The basic speed-up technique just demonstrated in the example of FIG. 2 applies equally well to all latching circuits. Two additional examples follow.

Figure 3:
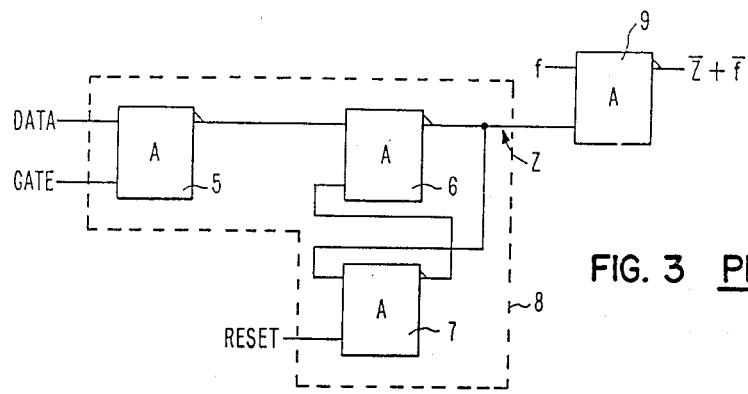
FIG. 3 is a schematic circuit diagram of a prior art gated flip-flop latching circuit.
Figure 4:
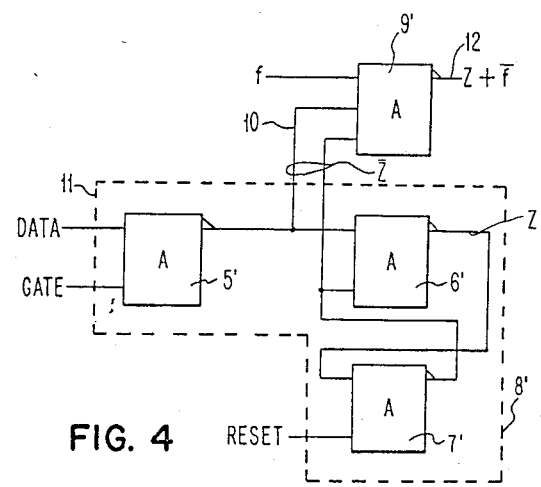
FIG. 4 is a reconfigured embodiment of the circuit of FIG. 3 in accordance with the present invention.

FIG. 3 illustrates a sampling gate flip-flip latching circuit such as described on page 75 of the cited "Manual of Logic Design" book. Inverting AND (NAND) blocks 5, 6 and 7 comprise latch 8. Block 9 provides the logic function following the latch. FIG. 4 is a schematic diagram of a functionally equivalent latching circuit which has been rearranged, in accordance with the present invention, in the new "speed-up" configuration. As in the case of FIG. 2, the output logic circuit function block (9' of FIG. 4) is connected in parallel with the output block (6' of FIG. 4) of the latch (8' of FIG. 4) rather than in tandem with it, as in the corresponding prior art case of FIG. 3. Again, as in the case of FIG. 2, an additional input is provided to the reconfigured output logic function block (9' of FIG. 4), the additional input being one of the signals (10 of FIG. 4), applied to the output block 6' of the latch (8' of FIG. 4).

The speed of the latching circuit of FIG. 4, as measured from the data input 11 of block 5' to the functional output 11 of block 9', is only two levels of logic as compared to three levels of logic in the corresponding prior art case of FIG. 3. It should be noted that the output function $Z+\bar{f}$ of FIG. 4 is slightly different from the output function $\bar{Z}+\bar{f}$ of FIG. 3. This difference in output function between a given prior art latching circuit and the corresponding reconfigured "speed-up"

latching circuit, designed in accordance with the present invention, results whenever NAND or NOR circuits are used as the basic building blocks in the latching circuits and the final output is taken from the inverting output terminal as in FIG. 4.

The difference in output function, however, is not a liability because the logic designer is free to place inverted data into the "speed-up" latching circuit, rather than "true" data, if it is desired to perform exactly the same function as that of the corresponding prior art circuit while still eliminating one level of logic delay relative to the prior art circuit.

Figure 5:
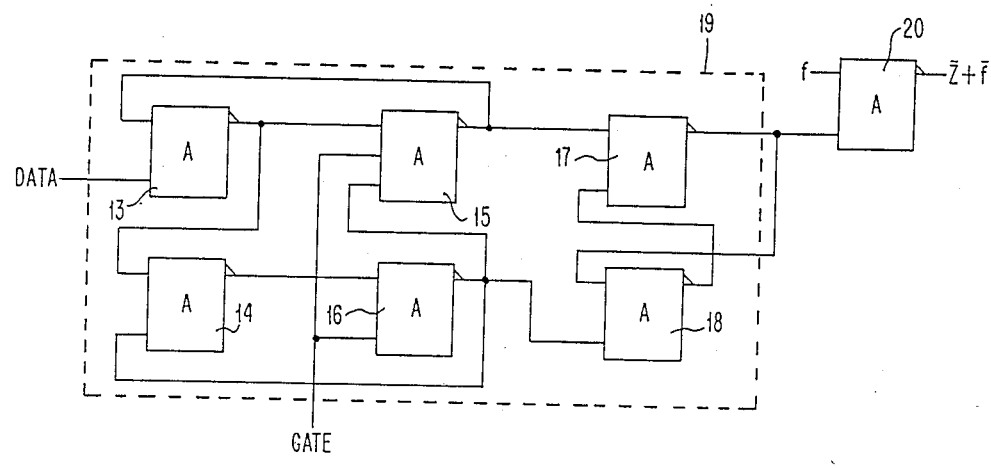
FIG. 5 is a schematic circuit diagram of a prior art sampling gate flip-flop latching circuit.

FIG. 5 represents a prior art sampling gate flip-flop latching circuit such as shown on page 109 of the cited book "Manual of Logic Design". NAND blocks 13, 14, 15, 16, 17 and 18 comprise latch 19. Block 20 provides the logic function following the latch.

Figure 6:
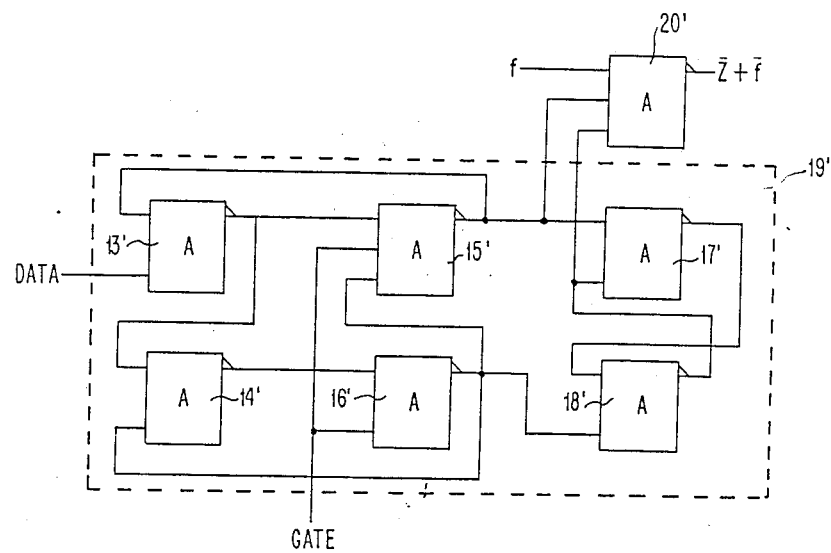
FIG. 6 is a reconfigured embodiment of the circuit of FIG. 3 in accordance with the present invention.

FIG. 6 shows the "speed-up" reconfigured latching circuit, designed in accordance with the present invention, corresponding in function to the circuit of FIG. 5 but having one less logic level of delay. The speed of the latching circuit of FIG. 5 as measured from the DATA input of block 13' to the output of block 20' is due to five levels of logic delay (blocks 13', 14', 16', 18' and 20'). Six levels of logic delay (blocks 13, 14, 16, 18, 17 and 20) are inherent in the conventional latching circuit of FIG. 5. Similarly, the speed as measured from the GATE input line of FIG. 6 to the output of block 20' is due to three levels of logic delay versus four levels for the circuit of FIG. 5. Once again, output block 20' is connected to receive the same signal inputs as block 17' (at the output of latch 19'), together with logic function signal f, as was the case with analogous output blocks 9' and 4' of the other exemplary embodiments of FIGS. 4 and 2, respectively. As in the case of FIG. 4, the circuit of FIG. 6 provides a modified output function $(Z+\bar{f})$ as compared with the output function $(\bar{Z}+\bar{f})$ of the corresponding prior art circuit of FIG. 5. As previously explained, that result is attributable to the use of NAND blocks and the inverting output of the final block 20'. The placing of inverted data instead of true data, into latch 19' would restore the output function $\bar{Z}+\bar{f}$, if desired.

We claim:

1. In a latching circuit array of logic gates wherein a latch comprising some of said gates and responsive to a logic signal is drivably connected to an output logic circuit comprising at least one other of said gates, said latch having an output gate having at least two inputs, said output gate and said one other of said gates being of the same kind, means for connecting each of the inputs of said output gate of said latch to respective ones of inputs of said one other of said gates, and means for applying at least one additional signal to at least one additional input of said one other of said gates but not to any of said gates of said latch.

2. The circuit of claim 1 wherein said output gate and said one other of said gates are NAND gates.

3. The circuit of claim 1 wherein said output gate and said one other of said gates are NOR gates.

4. The circuit of claim 1 wherein all of said logic gates are of the same kind.

* * * * *